(12) United States Patent
Wang et al.

(10) Patent No.: US 7,948,570 B2
(45) Date of Patent: May 24, 2011

(54) THIN FILM TRANSISTOR ARRAY SUBSTRATE AND MANUFACTURING METHOD THEREOF

(75) Inventors: Zhangtao Wang, Beijing (CN); Haijun Qiu, Beijing (CN); Tae Yup Min, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 238 days.

(21) Appl. No.: 12/270,206

(22) Filed: Nov. 13, 2008

(65) Prior Publication Data

US 2009/0225249 A1 Sep. 10, 2009

(30) Foreign Application Priority Data

Mar. 7, 2008 (CN) .......................... 2008 1 0101545

(51) Int. Cl.
*G02F 1/136* (2006.01)
(52) U.S. Cl. ......................................................... 349/43
(58) Field of Classification Search .................. None
See application file for complete search history.

(56) References Cited

U.S. PATENT DOCUMENTS

2008/0151136 A1* 6/2008 Jung et al. ........................ 349/46

FOREIGN PATENT DOCUMENTS

| CN | 1504819 A | 6/2004 |
| CN | 1553269 A | 12/2004 |
| KR | 2008-0003187 A | 1/2008 |

* cited by examiner

*Primary Examiner* — Sung H Pak
(74) *Attorney, Agent, or Firm* — Ladas & Parry LLP

(57) ABSTRACT

A thin film transistor (TFT) array substrate for a liquid crystal display comprises a gate line and a data line formed in a display region, a gate connecting line and a data connecting line formed in a PAD region, and a TFT formed at an intersection between the gate line and the data line. The TFT comprises a gate electrode on a base substrate, a gate insulating layer on the gate electrode, a semiconductor layer on the gate insulating layer, a doped semiconductor layer on the semiconductor layer, and a source electrode and a drain electrode that are on the doped semiconductor layer, and a TFT channel is defined in the semiconductor layer between the source electrode and the drain electrode. The array substrate further comprises a passivation layer that is formed on the source electrode and the drain electrode and a pixel electrode, a portion of which is formed under the drain electrode and connected with the drain electrode.

10 Claims, 9 Drawing Sheets

THIN FILM TRANSISTOR ARRAY SUBSTRATE AND MANUFACTURING METHOD THEREOF

FIELD OF THE INVENTION

The present invention relates to a thin film transistor liquid crystal display (TFT-LCD) and a manufacturing method thereof.

BACKGROUND OF THE INVENTION

A thin film transistor liquid crystal display (TFT-LCD) has many merits such as small volume, lower power consumption, and being free of radiation and is gaining a important role in the flat panel display market. As for a TFT-LCD, product quality, yield and price are mainly determined by the structure and the manufacturing process of an array substrate structure thereof.

In order to effectively decrease price and increase yield of a TFT-LCD, the process of manufacturing the array substrate (active matrix driven TFT array) of a TFT-LCD has been simplified gradually. The method has been developed from the initial seven-mask process to the current four-mask process that is based on slit photolithography technology. The key points of the four-mask process is to use a slit photolithography process to replace both the second photolithography (active layer photolithography) process and the third photolithography (source/drain layer photolithography) process in a traditional five-mask process. The four-mask process is described as follows: first forming a gate electrode with a first photolithography process; depositing a gate insulating layer, a semiconductor layer, a doped semiconductor layer (ohmic contact layer) and a source/drain metal layer on the gate electrode sequentially; performing the second photolithography process with a slit mask, and forming patterns of a data line, an active layer, source/drain electrodes and a TFT channel by a wet etching and a multi-step etching (etching the semiconductor layer→ashing photoresist pattern→dry etching→etching the doped semiconductor layer); depositing a passivation layer, and forming a via hole in the passivation layer with a third photolithography process; finally, depositing a transparent conductive layer, and forming a pixel electrode with a fourth photolithography process. It is necessary for the second photolithography process to form the patterns of the active layer, the source/drain electrodes and the TFT channel by means of the slit lithography technique. The principle of the slit lithography technique is to form slits of a size on a mask and control the transmission of the light for exposing with light diffraction due to the presences of slits, so as to selectively control the thickness of the exposed and developed photoresist. Further, the thickness of the photoresist directly determines the aspect ration of the TFT device, i.e., the electrical characteristic of the TFT device.

Practice shows that the four-mask process embodies two disadvantages. Due to a limitation on the accuracy of manufacturing a mask with slits and the influence of the distribution uniformity of the transmission of the mask and the uniformity of the subsequent photoresist ashing process, there exists some difference for the transmission in different areas, and this difference may in turn cause the various defects in the TFT channel, decreasing the electrical characteristics uniformity of the TFT across the whole substrate and degrading the display quality of the TFT-LCD. As one of the key processes of the slit photolithography process, the multi-step etching process is used to form the patterns of the active layer and the source/drain together with the TFT channel and comprises etching of the semiconductor layer, ashing of the photoresist at the channel, and etching of the source/drain electrodes at the channel and etching of the doped semiconductor layer. These etching processes are performed in the same apparatus sequentially, which tends to cause the various kinds of defects in pixels because of the slit photolithography process, so that the yield and the product quality are difficult to be ensured.

SUMMARY OF THE INVENTION

An embodiment of the invention provides a thin film transistor (TFT) array substrate for a liquid crystal display. The array substrate comprises a gate line and a data line formed in a display region, a gate connecting line and a data connecting line formed in a PAD region, and a TFT formed at an intersection between the gate line and the data line. The TFT comprises a gate electrode on a base substrate, a gate insulating layer on the gate electrode, a semiconductor layer on the gate insulating layer, a doped semiconductor layer on the semiconductor layer, and a source electrode and a drain electrode that are on the doped semiconductor layer, and a TFT channel is defined in the semiconductor layer between the source electrode and the drain electrode. The array substrate further comprises a passivation layer that is formed on the source electrode and the drain electrode and a pixel electrode, a portion of which is formed under the drain electrode and connected with the drain electrode.

Another embodiment of the invention provides a method of manufacturing a thin film transistor (TFT) array substrate for a liquid crystal display. The method comprises the steps of:

(1) depositing a gate metal layer on a base substrate and forming a pattern of a gate electrode and a gate line in a display region and a pattern of a gate connecting line in a gate line PAD region through a first patterning process;

(2) depositing sequentially a gate insulation layer, a semiconductor layer and a doped semiconductor layer on the base substrate after step 1 and forming patterns of a gate insulation layer, a semiconductor layer and a doped semiconductor layer on the gate line and the gate electrode in the display region through a second patterning process;

(3) depositing a transparent conductive layer on the base substrate after step 2 and forming a pattern of a pixel electrode by a third patterning process; and (4) depositing sequentially a source/drain metal layer and a passivation layer on the base substrate after step 3, forming patterns of a drain electrode, a source electrode, a data line and a TFT channel in the display region and forming a data connecting line in a data line PAD region through a fourth patterning process, wherein the doped semiconductor layer in the TFT channel between the drain electrode and the source electrode is removed, the drain electrode is connected with the pixel electrode, the gate connecting line is exposed through a gate connecting line via hole in the gate line PAD region, and the data connecting line is exposed through a data connecting line via hole in the data line PAD region.

The embodiments of the invention provide a TFT array substrate for a LCD and a manufacturing method thereof. A four-mask process is adopted; however it is different from the conventional four-mask process using a gray tone mask. Specifically, in the embodiments of the invention, the structure of the data line PAD region is formed with a gray tone process, and the TFT channel is formed through the conventional photolithography and etching process, so that the defects of the pixels in the conventional four-mask process using a gray tone mask can be efficiently reduced, which improves the product yield and quality of the TFT array substrate for a LCD. At the same time, since the TFT channel is formed through the conventional photolithography, the uniformity of the channel length of the TFT can be improved, and the uniformity of the electrical characteristics of the TFT can be improved. The manufacturing method of the TFT array substrate structure for a LCD according to the embodiment is simple, stable and easy to realize, which decreases the requirement on equipment, reduces product period and decreases product cost.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 2b is a cross-sectional view of a display region, a gate line PAD region and a data line PAD region in the structure corresponding to FIG. 2a.

FIG. 3b is the cross-sectional view of the display region, the gate line PAD region and the data line PAD region in the structure corresponding to FIG. 3a;

FIG. 4b is a cross-sectional view of the display region, the gate line PAD region and the data line PAD region in the structure corresponding to FIG. 4a;

FIG. 6b is a cross-sectional view of a display region, a gate line PAD region and a data line PAD region in the structure corresponding to FIG. 6a;

FIG. 7b is a cross-sectional view of the display region, the gate line PAD region and the data line PAD region in the structure corresponding to FIG. 7a;

FIG. 8b is a cross-sectional view of the display region, the gate line PAD region and the data line PAD region in the structure corresponding to FIG. 8a;

DESCRIPTION OF THE PREFERRED EMBODIMENTS

The embodiments of the invention are disclosed hereinafter with reference to the drawings. As used herein, a gray tone mask may be a mask with a transparent region, a translucent region and a blocked region, and the translucence region can be obtained with slits that can diffract light, a translucent material of low transmission and the like, thus a gray tone mask also comprises a half tone mask.

Figure 1A:
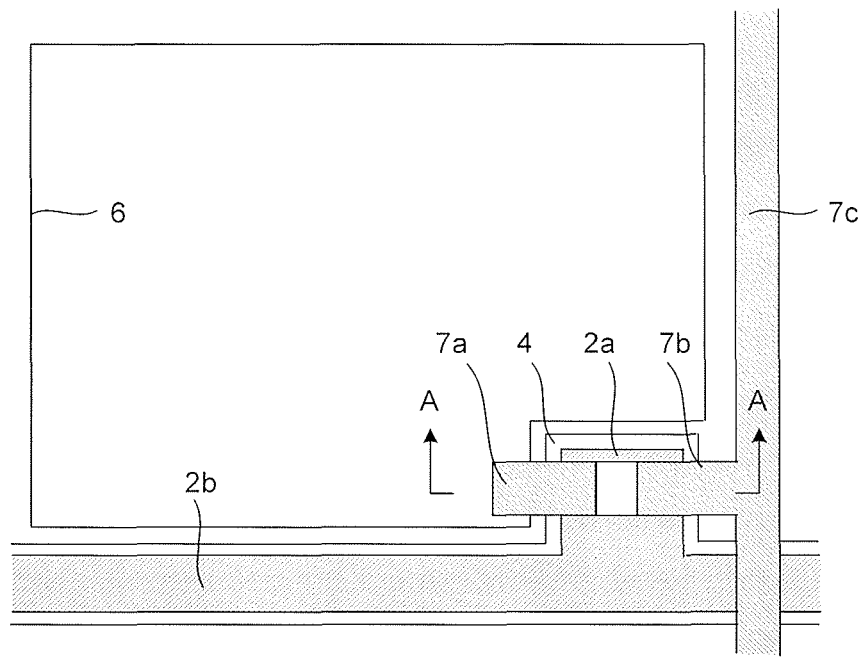
FIG. 1a is a plan view of a display region of a TFT array substrate for a LCD according to the invention.

FIG. 1a is a plan view of a display region of a thin film transistor (TFT) array substrate for a LCD according to an embodiment of the invention. As shown in FIG. 1a, the TFT array substrate for a LCD comprises a gate line 2b and a data line 7c formed in the display region of the array substrate. The gate line 2b and the data line 7c intersect each other and define a pixel region with a TFT formed at the intersection. The TFT comprises a gate electrode 2a connected with the gate line 2b, a semiconductor layer 4 served as a switch conducting medium and a drain electrode 7a and a source electrode 7b with a channel 4a of the TFT defined therebetween. The source electrode 7b is connected with the data line 7c, a pixel electrode 6 is partially under a portion of the drain electrode 7a and connected with the drain electrode 7a, and the semiconductor layer is on an insulating layer above the gate line and the gate electrode. In addition, the TFT array substrate for a LCD further comprises a gate connecting line formed in a gate line PAD region of the array substrate and a data connecting line formed in a data line PAD region.

Figure 1B:
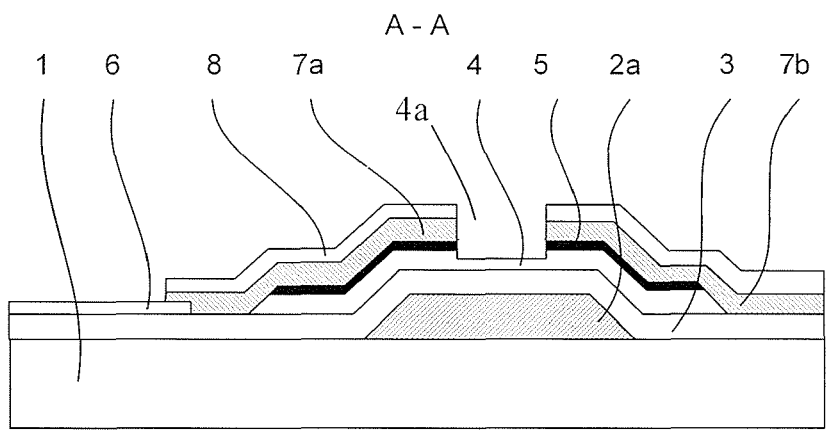
FIG. 1b is a cross-sectional view of a first embodiment of the TFT array substrate structure for LCD according to the invention.

FIG. 1b is a cross-sectional view of a first embodiment of the TFT array substrate for a LCD according to the invention, a cross-sectional view along line A-A in FIG. 1a. As shown in FIG. 1b, in the display region of the array substrate, the gate electrode 2a is formed on a base substrate 1, a gate insulating layer 3 is formed across the base substrate 1 with the gate electrode pattern thereon, and the semiconductor layer 4 and the doped semiconductor layer 5 are formed on the gate electrode 2a sequentially. The pixel electrode 6 is formed on the gate insulating layer 3 at one side of the gate electrode 2a, the drain electrode 7a and the source electrode 7b defining the TFT channel 4a therebetween are formed on the semiconductor layer 4 and the doped semiconductor layer 5, the pixel electrode 6 is partially under a portion of the drain electrode 7a and connected with the drain electrode 7a, and a passivation layer 8 is formed on the drain electrode 7a and the source electrode 7b.

Figure 1C:
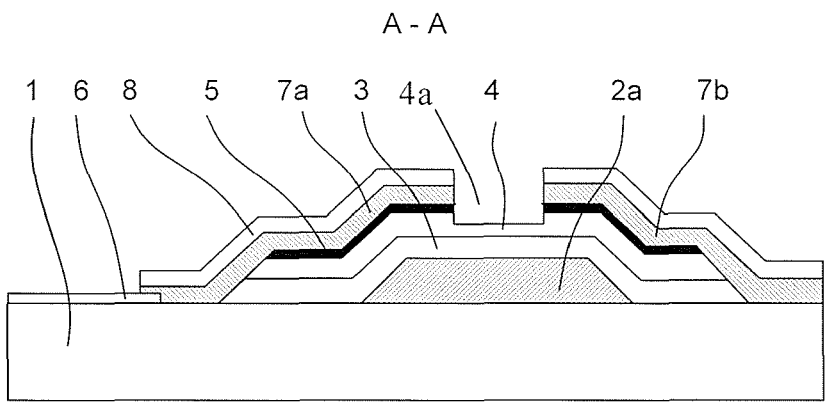
FIG. 1c is a cross-sectional view of a second embodiment of the TFT array substrate structure for LCD according to the invention.

FIG. 1c is a cross-sectional view of a second embodiment of the TFT-LCD array substrate according to the invention, a cross-sectional view along the line A-A in FIG. 1a. As shown in FIG. 1c, in the display region of the array substrate, the gate electrode 2a is formed on the base substrate 1, and the gate insulating layer 3 the semiconductor layer 4 and the doped semiconductor layer 5 are formed on the gate electrode pattern sequentially. The pixel electrode 6 is formed on the base substrate 1 at one side of the gate electrode 2a, the drain electrode 7a and the source electrode 7b defining the TFT channel 4a are formed on the semiconductor layer 4 and the doped semiconductor layer 5, the pixel electrode 6 is partially under a portion of the drain electrode 7a and connected with the drain electrode 7a, and the passivation layer 8 is formed on the drain electrode 7a and the source electrode 7b.

FIG. 2a~FIG. 9d are schematic views showing a manufacturing method of the TFT array substrate for a LCD according to an embodiment of the invention. Hereinafter, the embodiment of the invention is further described in connection with two manufacturing processes of the TFT array substrate for a LCD. In the following description, the patterning process in the embodiment of the invention comprises the processes of applying photoresist, masking, exposing, etching and the like.

First Embodiment

Figure 2A:
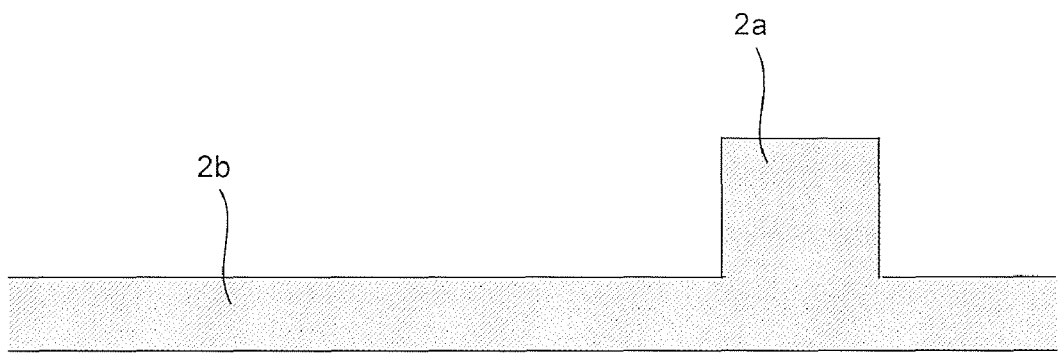
FIG. 2a is a plan view of the first embodiment after a first patterning process according to the invention.
Figure 2B:
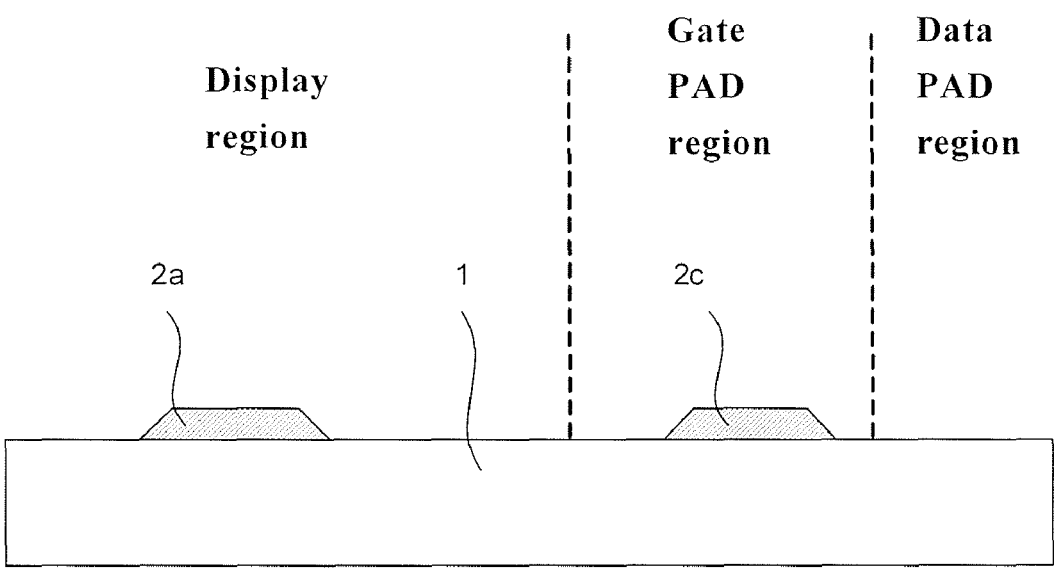

FIG. 2a is a plan view of the first embodiment after a first patterning process in the embodiment, and FIG. 2b is a cross-sectional view of a display region, a gate line PAD region and a data line PAD region in the structure in FIG. 2a. A gate metal layer is deposited on the base substrate 1 (e.g., a glass substrate, a quartz substrate, or a plastic substrate) to a thickness of 500 Å~4000 Å by a sputtering method or a thermal evaporation method. The gate metal layer may be a metal such as Cr, W, Ti, Ta, Mo, Al, Cu or an alloy thereof, and the gate metal layer may also be a multi-layer metal thin film. The gate metal layer is etched through the first patterning process to form a pattern of a gate electrode 2a and a gate line 2b on the display region and form a pattern of a gate connecting line 2c in the gate line PAD region on the base substrate 1, as shown in FIGS. 2a and 2b.

Figure 3A:
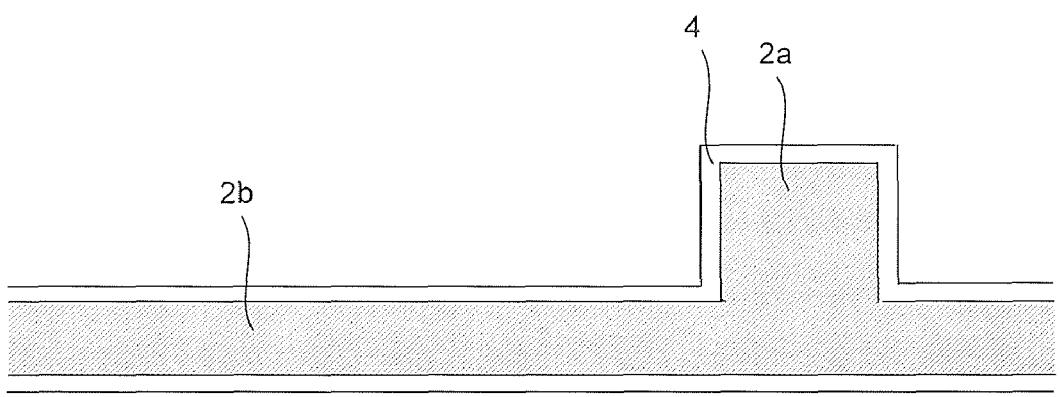
FIG. 3a is a plan view of the first embodiment after a second patterning process.
Figure 3B:
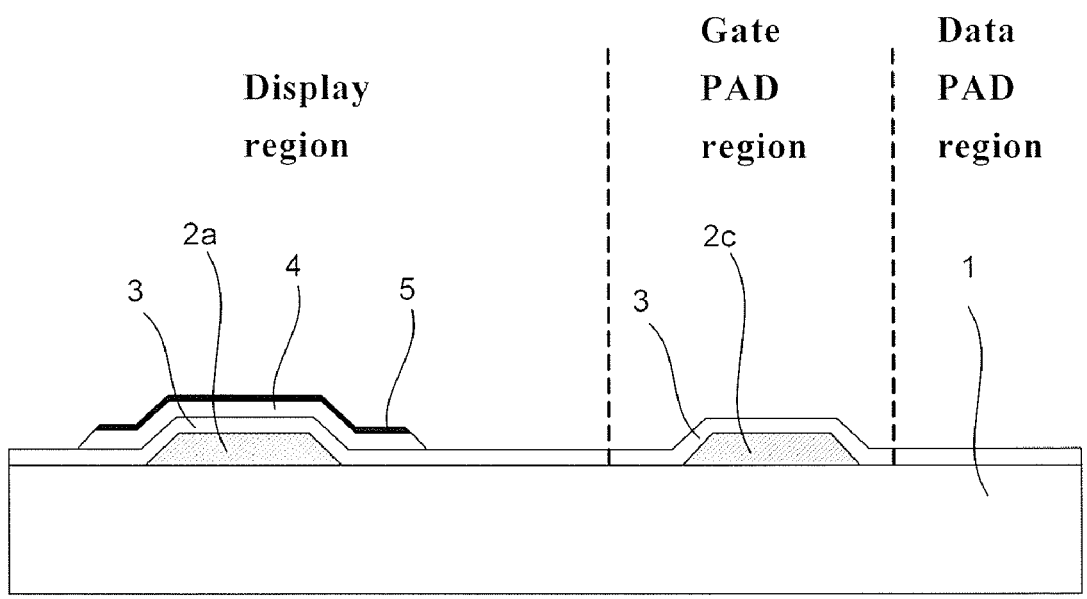

FIG. 3a is a plan view of the first embodiment after a second patterning process, and FIG. 3b is a cross-sectional view of the display region, the gate line PAD region and the data line PAD region in the structure in FIG. 3a. A gate insulating layer 3 with a thickness of 1000 Å~4000 Å, a semiconductor layer 4 with a thickness of 1000 Å~3000 Å and a doped semiconductor layer (ohmic contact layer) 5 with a thickness of 300 Å~600 Å are formed on the base substrate 1 with patterns of the gate electrode and the gate line formed thereon. The semiconductor layer 4 and the doped semiconductor layer 5 constitute an active layer for TFT. The gate insulating layer may be oxide, nitride or oxynitride and the corresponding reactant gas may be a mixture gas of $SiH_4$, $NH_3$ and $N_2$ or a mixture gas of $SiH_2Cl_2$, $NH_3$ and $N_2$. The reactant gas for depositing the semiconductor layer 4 (e.g., an amorphous silicon layer) may be a mixture gas of $SiH_2$ and $H_2$ or a mixture gas of $SiH_2Cl_2$ and $H_2$, and the reactant gas for depositing the doped semiconductor layer (e.g., a doped amorphous silicon layer) 5 may be a mixture gas of $SiH_4$, $H_2$ and $PH_3$ or a mixture gas of $SiH_2Cl_2$, $H_2$ and $PH_3$. After depositing the above layers, the semiconductor layer and the doped semiconductor layer are etched through the second patterning process, remove the semiconductor layer and the doped semiconductor layer in the gate line PAD region and the data line PAD region, and form a pattern of the semiconductor layer 4 and the doped semiconductor layer 5 in the display region, as shown in FIG. 3a and FIG. 3b. In the embodiment, the etching gas for the semiconductor layer and the doped semiconductor layer may be $SF_6/Cl_2$, $SF_6/HCl$, and the like.

Figure 4A:
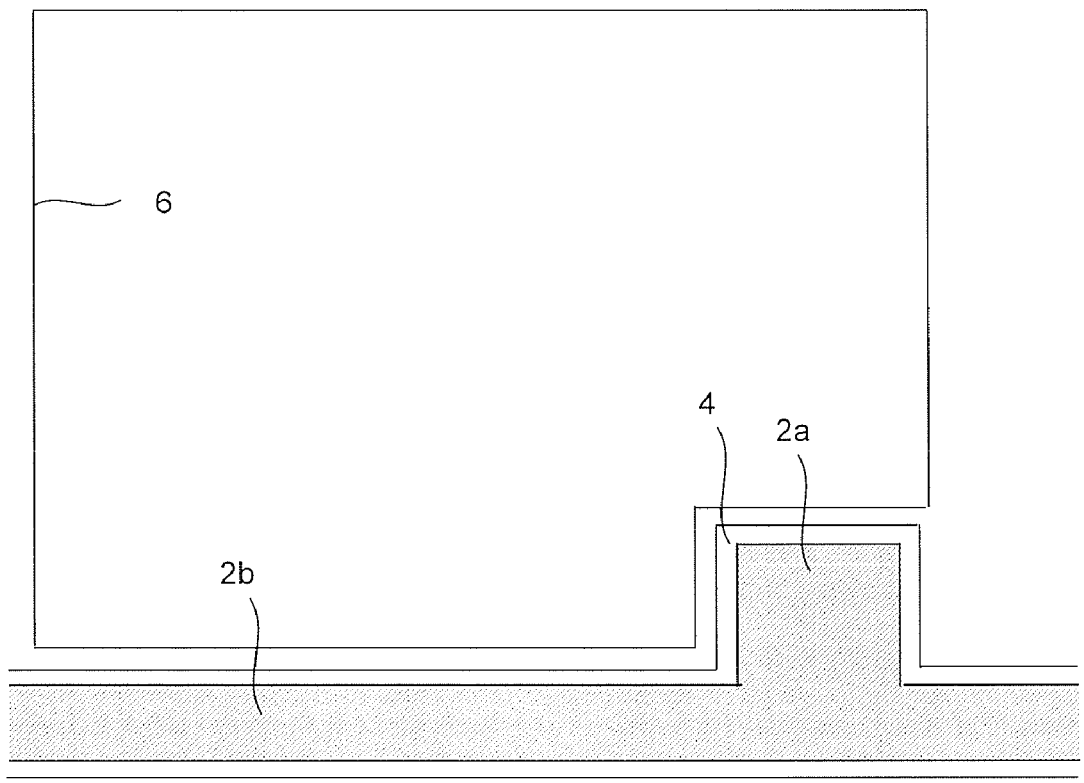
FIG. 4a is a plan view of the first embodiment after a third patterning process.
Figure 4B:
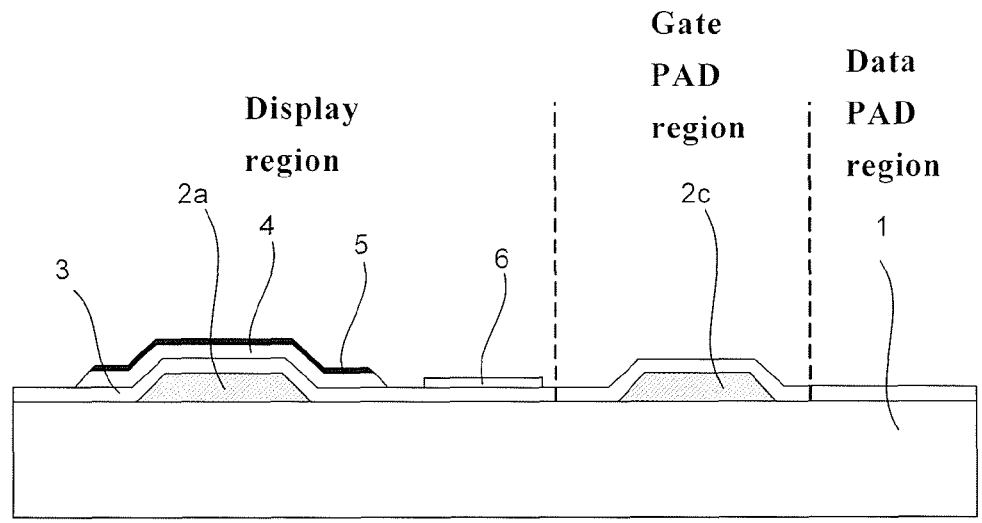

FIG. 4a is a plan view of the first embodiment after a third patterning process, and FIG. 4b is a cross-sectional view of the display region, the gate line PAD region and the data line PAD region in the structure corresponding to FIG. 4a. A transparent conductive layer with a thickness of 300 Å~600 Å is deposited by a sputtering method or a thermal evaporating method after forming the pattern of the semiconductor layer 4 and the doped semiconductor layer 5, and the transparent conductive layer may be indium tin oxide (ITO) or indium zinc oxide (IZO). The transparent conductive layer is etched through the third patterning process so as to form a pattern of a pixel electrode 6 in a pixel region. In the embodiment, the pixel electrode 6 is formed on the gate insulating layer 3, as shown in FIG. 4a and FIG. 4b.

Figure 5A:
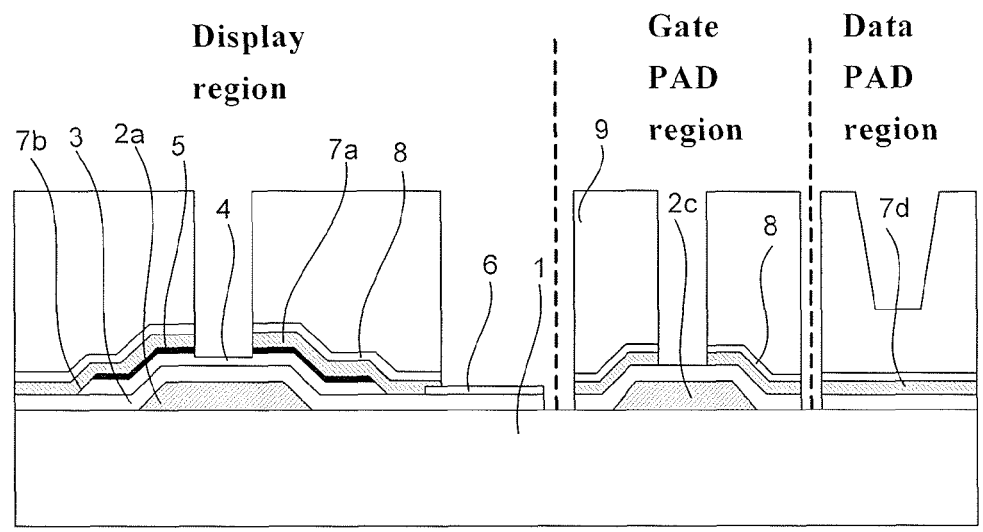
FIG. 5a is a cross-sectional view of the first embodiment after a first etching in a fourth patterning process.
Figure 5B:
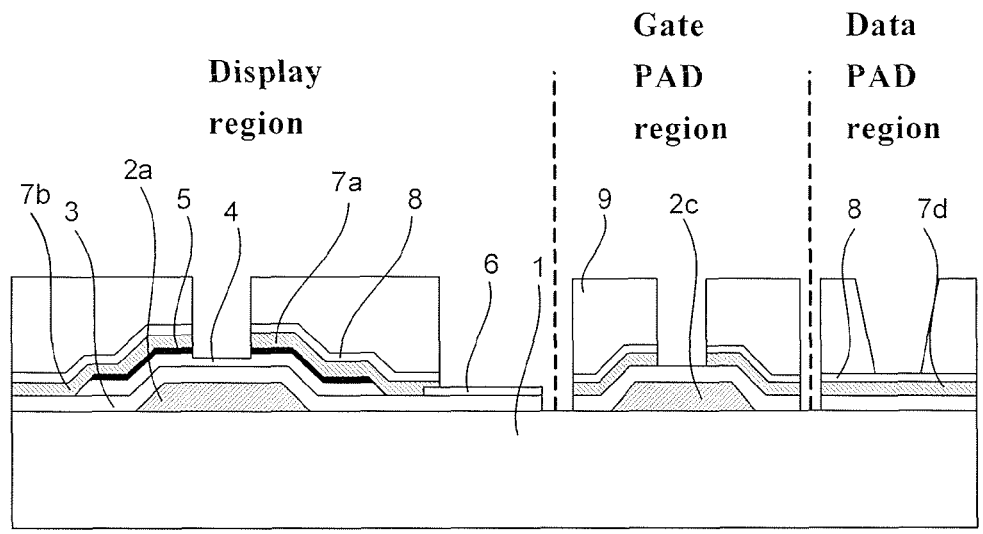
FIG. 5b is a cross-sectional view of the first embodiment after a second etching in the fourth patterning process.

FIG. 5a~FIG. 5b is cross-sectional views of the display region, the gate line PAD region and the data line PAD region showing the condition after each etching in a fourth patterning process, respectively. After forming the pixel electrode 6, a source/drain metal layer is deposited to a thickness of 500 Å~2500 Å by a sputtering method or a thermal evaporation method, and the source/drain metal layer may be a metal such as Cr, W, Ti, Ta, Mo, Al, Cu or an alloy thereof. Subsequently, a passivation layer 8 is deposited to a thickness of 700 Å~2000 Å by a plasma enhanced chemical vapor deposition (PECVD) method. The passivation layer 8 may be oxide, nitride or oxynitride, and the corresponding reactant gas may be a mixture gas of $SiH_4$, $NH_3$ and $N_2$ or a mixture gas of $SiH_2Cl_2$, $NH_3$ and $N_2$. After depositing the passivation layer 8, a photoresist film 9 is applied on the resultant substrate and a photolithography process is performed with a gray tone mask to form a gray tone photoresist pattern. A normal photolithography process is performed for the display region, the gate line PAD region and other regions needed to be opened on the gate metal layer, and the gray tone photolithography is performed for the data line PAD region and other region needed to be opened on the source/drain metal layer. Specifically, the gray tone photoresist pattern has a normal thickness in the display region and the gate line PAD region and has a reduced thickness corresponding to via holes to be formed in the data line PAD region.

FIG. 5a is a cross-sectional view of the first embodiment after the first etching in the fourth patterning process. Firstly, the first etching process in the fourth patterning process is performed by using the gray tone photoresist pattern as an etching mask on the exposed passivation layer 8, the underlying source/drain metal layer and the doped semiconductor layer 5 in the display region so as to form the patterns of a drain electrode 7a, a source electrode 7b, a data line 7c and a TFT channel 4a. The source electrode 7b is connected with the data line 7c, the drain electrode 7a is connected with the pixel electrode 6, and a pattern of a data connecting line 7d is formed in the data line PAD region. The exposed passivation layer 8 and the underlying source/drain metal layer in the gate line PAD region are etched. Although the semiconductor layer and the doped semiconductor layer in the gate line PAD region have been etched in the second patterning process, since the etching process for the doped semiconductor layer has a good selectivity (normally larger than 5) to the gate insulating layer, the exposed gate insulating layer 3 in the gate line PAD region is remained. In the embodiment, the etching gas for the passivation layer 8 may be $SF_6/O_2$, $Cl_2/O_2$, $CF_4/O_2$ and the like, and the etching gas for the semiconductor layer 5 may be $SF_6/Cl_2$ and the like. In the data line PAD region, since the photoresist film 9 is in a reduced thickness, no etching occurs in this region, as shown in FIG. 5a.

FIG. 5b is a cross-sectional view of the first embodiment after the second etching in the fourth patterning process according to the invention. Thereafter, the second etching process in the fourth patterning process is performed, i.e., the ashing process on the photoresist film 9, so that the photoresist film 9 in a reduced thickness formed by a partial exposure in the data line PAD region is removed, and the passivation layer 8 therebelow is exposed accordingly. Since the ashing process for the photoresist film has a good selectivity (normally larger than 10) to the semiconductor layer exposed in the display region and the gate insulating layer exposed in the gate line PAD region, the semiconductor layer 4 at the TFT channel and the gate insulating layer 3 in the gate line PAD region are not etched in the process, as shown in FIG. 5b. In the present embodiment, the etching gas for the ashing process may be $O_2$, $SF_6/O_2$ and the like.

Figure 5C:
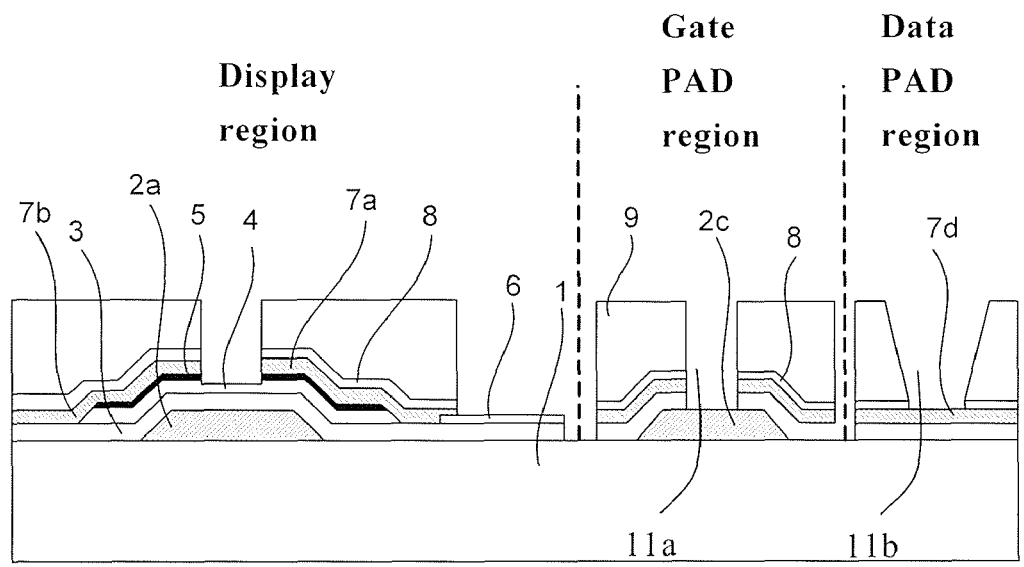
FIG. 5c is a cross-sectional view of the first embodiment after a third etching in the fourth patterning process.

FIG. 5c is a cross-sectional view of the first embodiment after the third etching in the fourth patterning process according to the invention. Thereafter, the third etching process in the fourth patterning process is performed. In the process, the display region is not etched, the gate insulating layer 3 in the gate line PAD region is etched so as to form a gate connecting line via hole 11b that exposes the gate connecting line 2c, and the passivation layer 8 in the data line PAD region is etched so as to form a data connecting line via hole 11a that exposes the data connecting line 7d, as shown in FIG. 5c. In the embodiment, the etching gas may be $SF_6/O_2$, $Cl_2/O_2$, $CF_4/O_2$ and the like. Since the etching process for the passivation layer has a good selectivity (normally larger than 5) to the semiconductor layer exposed in the display region, the semiconductor layer at the TFT channel is remained after the third etching process.

Figure 5D:
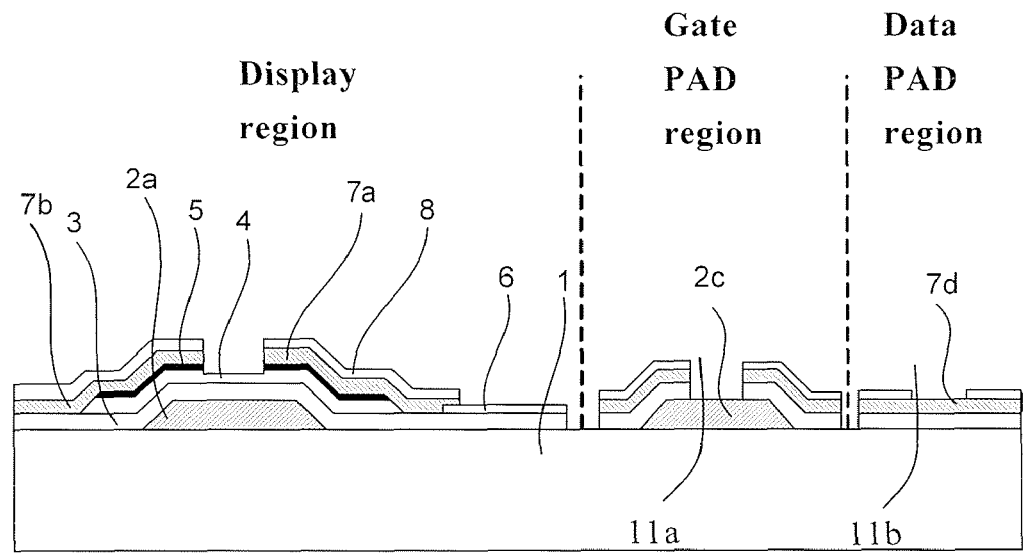
FIG. 5d is a cross-sectional view of the first embodiment after a fourth etching in the fourth patterning process.

FIG. 5d is a cross-sectional view of the first embodiment after the fourth etching in the fourth patterning process according to the invention. Finally, the fourth etching process in the fourth patterning process is performed, and the remained photoresist film is lifted off through a photoresist lifting-off process so as to complete the patterning process, as shown in FIG. 5d.

Figure 6A:
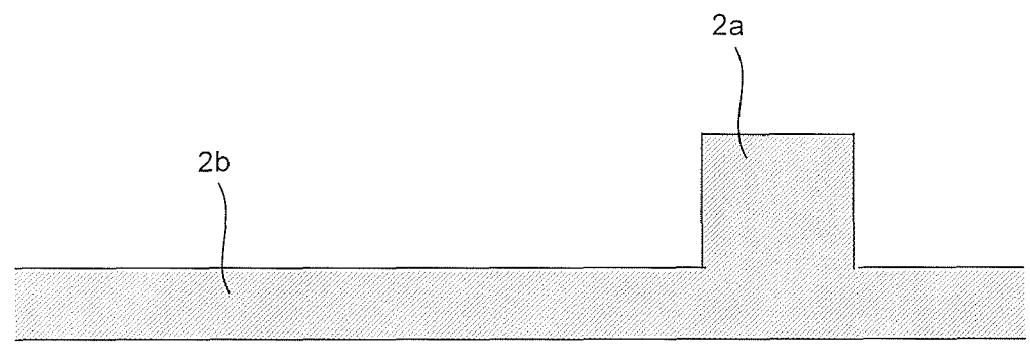
FIG. 6a is a plan view of the second embodiment after a first patterning process.
Figure 6B:
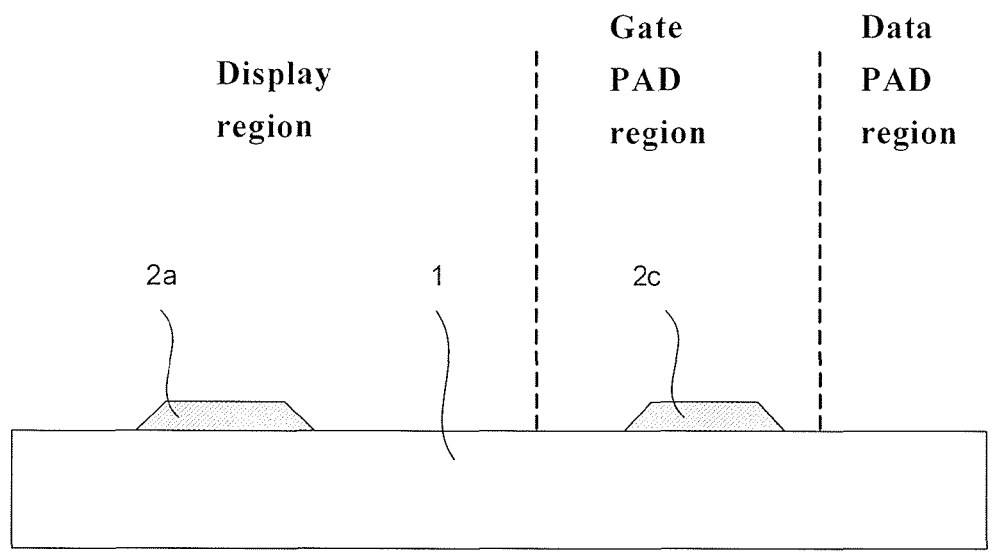

FIG. 6a is a plan view of a second embodiment after a first patterning process, and FIG. 6b is a cross-sectional view of the display region, the gate line PAD region and the data line PAD region in the structure in FIG. 6a. A gate metal layer is deposited to a thickness of 500 Å~4000 Å on a base substrate 1 (e.g., a glass substrate, a quartz substrate, or a plastic substrate). The gate metal layer may be a metal such as Cr, W, Ti, Ta, Mo, Al, Cu or an alloy thereof, and the gate metal layer may also be a multi-layer metal thin film. The gate metal layer is etched through the first patterning process to form a pattern of a gate electrode 2a and a gate line 2b in the display region on the base substrate 1, and form a pattern of a gate connecting line 2c at the gate line PAD region on the base substrate 1, as shown in FIG. 6a and FIG. 6b.

Figure 7A:
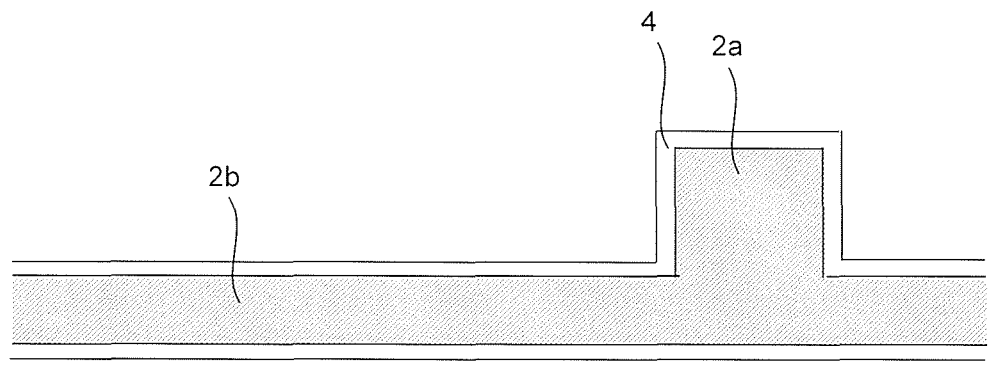
FIG. 7a is a plan view of the second embodiment after a second patterning process.
Figure 7B:
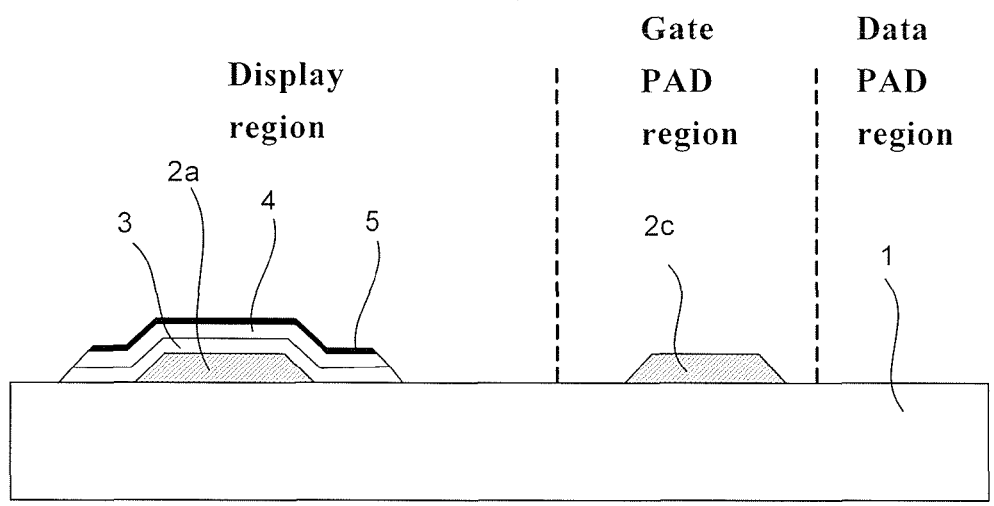

FIG. 7a is a plan view of the second embodiment after a second patterning process according to the invention and FIG. 7b is a cross-sectional view of the display region, the gate line PAD region and the data line PAD region in the structure in FIG. 7a. A gate insulating layer 3 with a thickness of 1000 Å~4000 Å, a semiconductor layer 4 with a thickness of 1000 Å~3000 Å, and a doped semiconductor layer (ohmic contact layer) 5 with a thickness of 300 Å~600 Å are formed on the base substrate with patterns of the gate electrode and the gate line. The semiconductor layer 4 and the doped semiconductor layer 5 constitute an active layer. The gate insulating layer may be oxide, nitride or oxynitride, and the corresponding reactant gas may be a mixture gas of $SiH_4$, $NH_3$ and $N_2$ or a mixture gas of $SiH_2Cl_2$, $NH_3$ and $N_2$. The reactant gas for depositing the semiconductor layer 4 (e.g., an amorphous silicon layer) may be a mixture gas of $SiH_2$, $H_2$ or a mixture gas of $SiH_2Cl_2$ and $H_2$, and the reactant gas for depositing the doped semiconductor layer (e.g., a doped amorphous silicon layer) 5 may be a mixture gas of $SiH_4$, $H_2$ and $PH_3$ or a mixture gas of $SiH_2Cl_2$, $H_2$ and $PH_3$. After depositing the above layers, the doped semiconductor layer, the semiconductor layer and the gate insulating layer are etched in the second patterning process to remove the doped semiconductor layer, the semiconductor layer and the gate insulating layer in the gate line PAD region and the data line PAD region, and form patterns of the semiconductor layer 4, the doped semiconductor layer 5 and the gate insulating layer 3 in the display region, as shown in FIG. 7a and FIG. 7b. In the embodiment, the etching gas for the semiconductor layer 4 and the doped semiconductor layer 5 may be $SF_6/Cl_2$, $SF_6/HCl$ and the like, and the etching gas for the gate insulating layer may be $SF_6/O_2$, $Cl_2/O_2$ and the like.

Figure 8A:
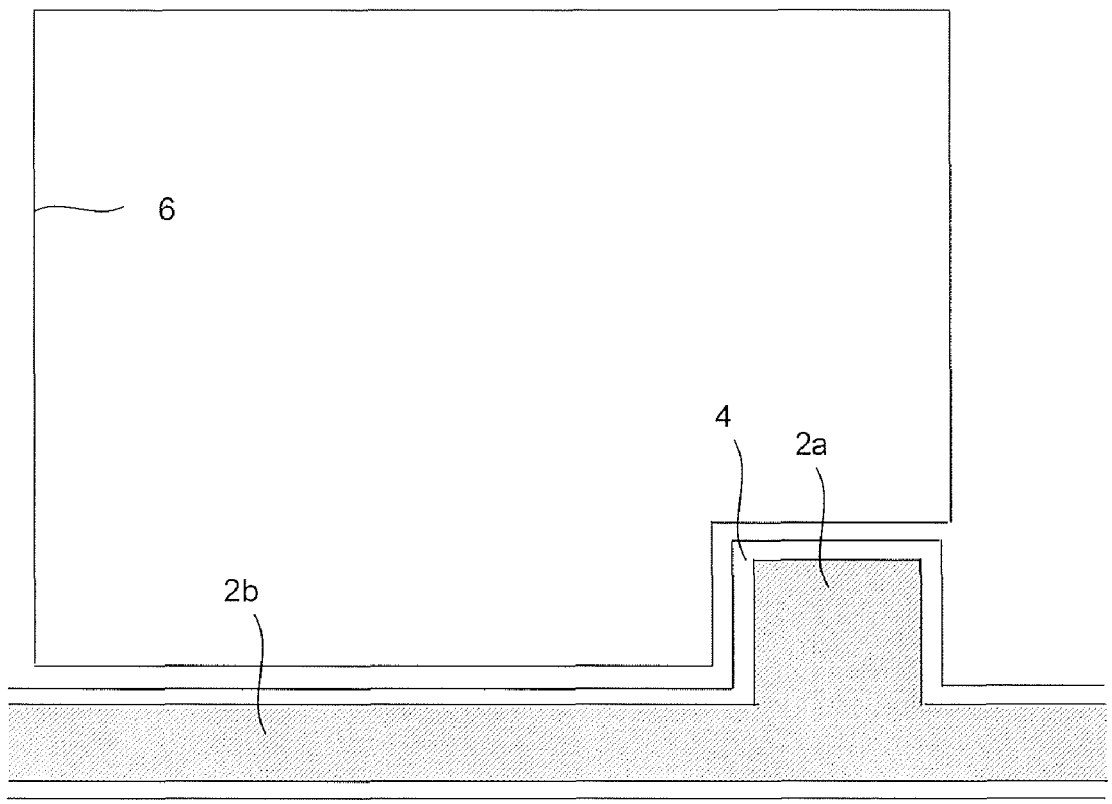
FIG. 8a is a plan view of the second embodiment after a third patterning process according to the invention.
Figure 8B:
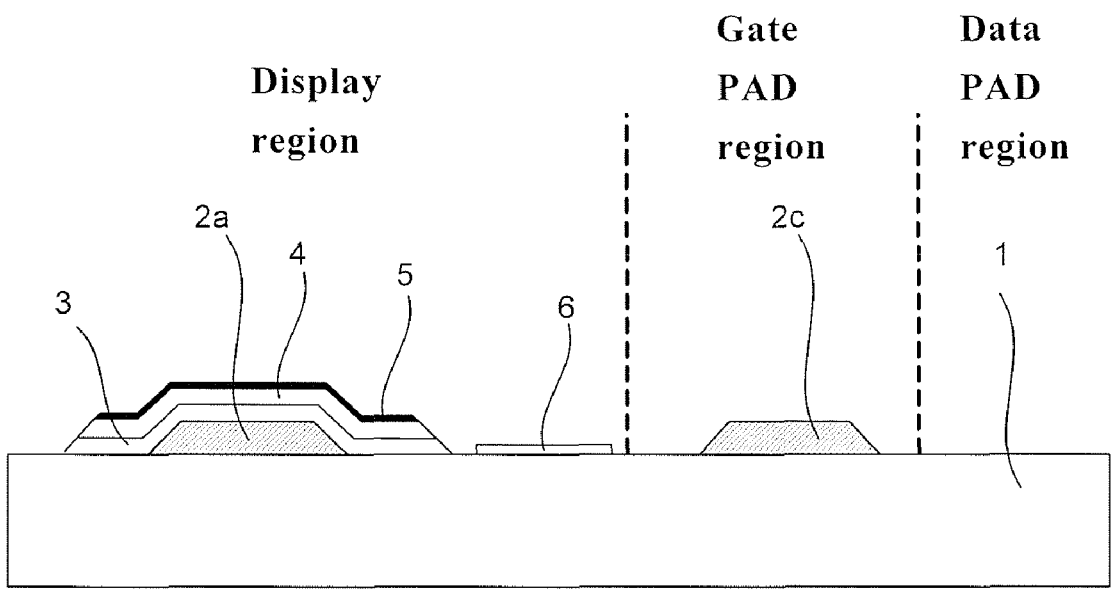

FIG. 8a is a plan view of the second embodiment after a third patterning process, and FIG. 8b is a cross-sectional view of the display region, the gate line PAD region and the data line PAD region in the structure in FIG. 8a. After forming the semiconductor layer 4, the doped semiconductor layer 5 and the gate insulating layer 3, a transparent conductive layer with a thickness of 300 Å~600 Å is deposited by a sputtering method and a thermal evaporation method, and the transparent conductive layer may be ITO or IZO. The transparent conductive layer is etched through the third patterning process so as to form a pattern of a pixel electrode 6 in the pixel region. In the embodiment, the pixel electrode 6 is on the base substrate, as shown in FIG. 8a and FIG. 8b.

FIG. 9a~FIG. 9d is the cross-sectional views of the display region, the gate line PAD region and the data line PAD region showing the condition for each etching process in the fourth patterning process. After forming the pixel electrode 6, a source/drain metal layer with a thickness of 500 Å~2500 Å is deposited by a sputtering method and a thermal evaporation method, and the source/drain metal layer may be a metal such as Cr, W, Ti, Ta, Mo, Al, Cu or an alloy thereof. Subsequently, a passivation layer 8 with a thickness of 700 Å~2000 Å is deposited by a PECVD method. The passivation layer 8 may be oxide, nitride or oxynitride, and the corresponding reactant gas may be a mixture gas of $SiH_4$, $NH_3$ and $N_2$ or a mixture gas of $SiH_2Cl_2$, $NH_3$ and $N_2$. After depositing the passivation layer 8, a photoresist film 9 is applied on the resultant substrate, and a photolithography process is performed using a gray tone mask. A normal lithography is performed for the display region, the gate line PAD region and other regions needed to be opened in the gate metal layer, and the gray tone technology is used for the data line PAD region and other region needed to be opened in the source/drain metal layer. Specifically, the gray tone photoresist pattern has a normal thickness in the display region and the gate line PAD region and has a reduced thickness corresponding to via holes to be formed in the data line PAD region.

Figure 9A:
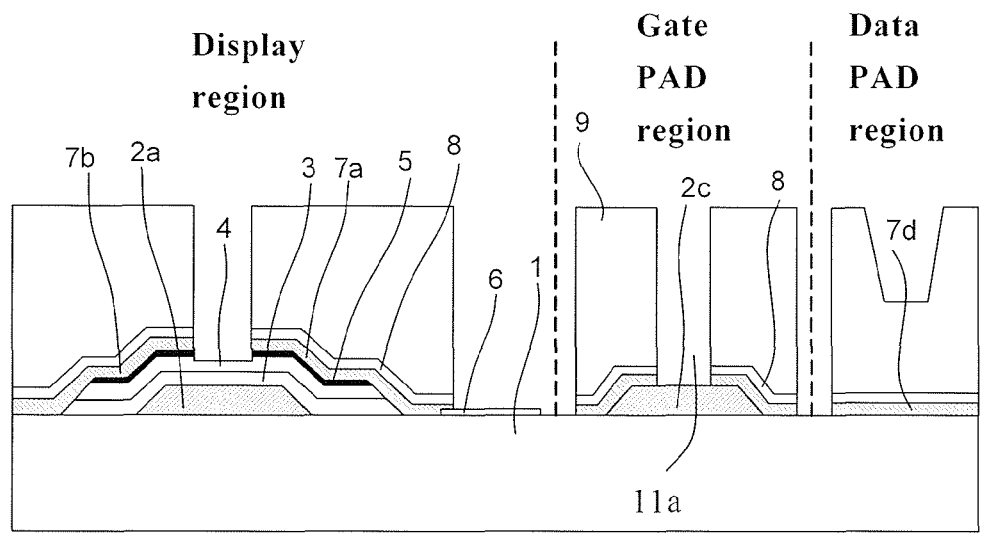
FIG. 9a is a cross-sectional view of the second embodiment after a first etching in a fourth patterning process.

FIG. 9a is a cross-sectional view of the second embodiment after the first etching in the fourth patterning process. Firstly, the first etching in the fourth patterning process is performed on the passivation layer 8, the underlying source/drain metal layer and the doped semiconductor layer exposed in the display region to form patterns of a drain electrode 7a, a source electrode 7b, a data line 7c, and a TFT channel. The source electrode 7b is connected with the data line 7c, the drain electrode 7a is connected with the pixel electrode 6, and a pattern of the data connecting line 7d is formed in the data line PAD region. The passivation layer 8 and the underlying source/drain metal layer exposed in the gate line PAD region is etched so as to form a gate connecting line via hole 11a that exposes the gate connecting line 2c. In the data line PAD region, since the photoresist film 9 with a reduced thickness is remained, no etching occurs, as shown in FIG. 9a. In the present embodiment, the etching gas for the passivation layer 8 may be $SF_6/O_2$, $Cl_2/O_2$, $CF_4/O_2$ and the like, the etching gas for the source/drain metal layer may be $Cl_2/O_2$, $HCl/O_2$, $SF_6/Cl_2/O_2$ and the like, and the etching gas for the doped semiconductor layer 5 may be $SF_6/Cl_2$ and the like.

Figure 9B:
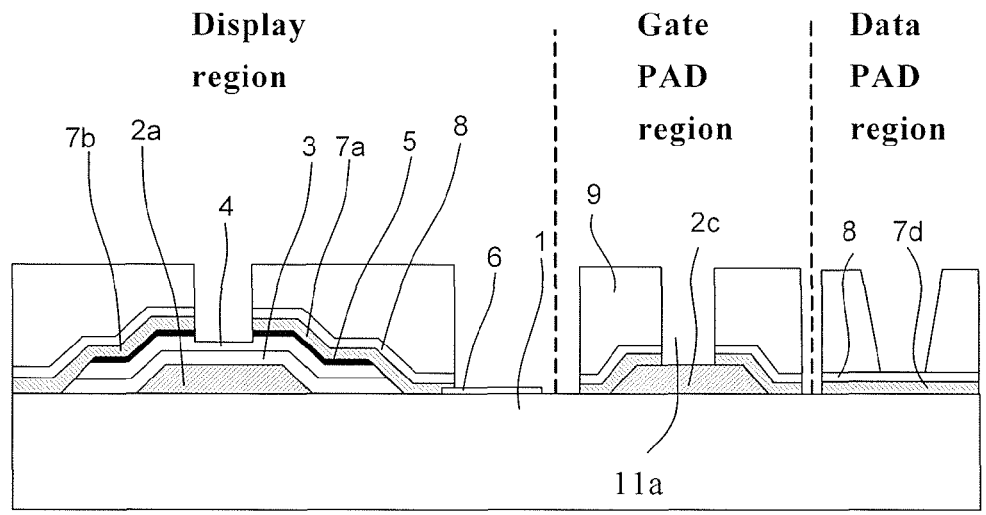
FIG. 9b is a cross-sectional view of the second embodiment after a second etching in the fourth patterning process.

FIG. 9b is a cross-sectional view of the second embodiment after the second etching in the fourth patterning process. Thereafter, the second etching process in the fourth patterning process is performed, i.e., the ashing process of the photoresist film 9, so that the photoresist film 9 with a reduced thickness formed by the partial exposure in the data line PAD region is removed, so as to expose the passivation layer therebelow. Since the ashing process has a good selectivity (normally larger than 10) to the semiconductor layer exposed in the display region, the semiconductor layer 4 at the TFT channel is not etched in the process, as shown in FIG. 9b. In the embodiment, the etching gas for the ashing process may be $O_2$, $SF_6/O_2$ and the like.

Figure 9C:
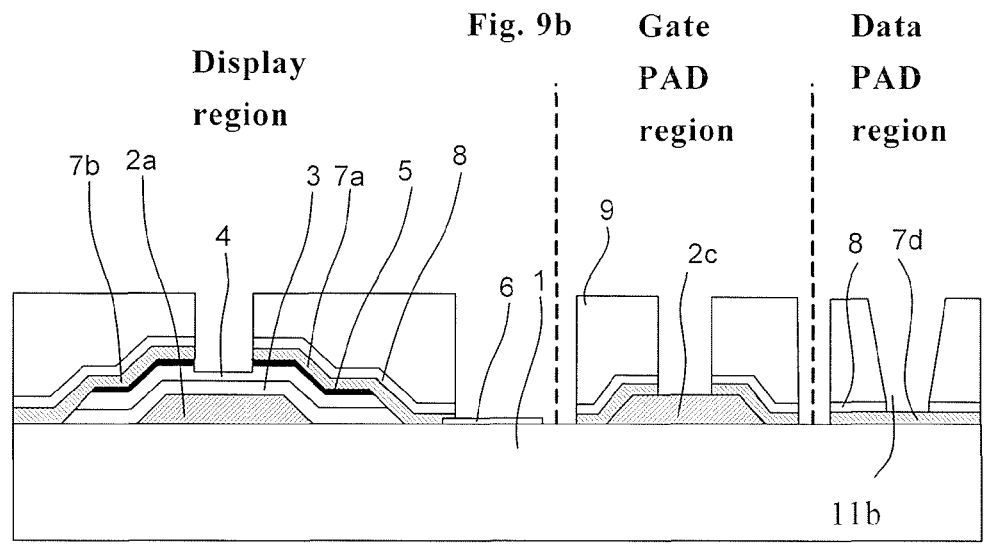
FIG. 9c is a cross-sectional view of the second embodiment after a third etching in the fourth patterning process.

FIG. 9c is a cross-sectional view of the second embodiment after the third etching in the fourth patterning process according to the invention. Thereafter, the third etching process in the fourth patterning process is performed. In the process, the display region and the gate line PAD region are not etched, but the passivation layer 8 in the data line PAD region is etched so as to form a data connecting line via hole 11a that exposes the data connecting line 7d, as shown in FIG. 9c. In the embodiment, the etching gas may be $SF_6/O_2$, $Cl_2/O_2$, $CF_4/O_2$ and the like. Since the etching process for the passivation layer 8 has a good selectivity (normally larger than 5) to the semiconductor layer and the gate metal layer, the semiconductor layer at the TFT channel and the gate metal layer in the gate line PAD region are remained after the third etching process.

Figure 9D:
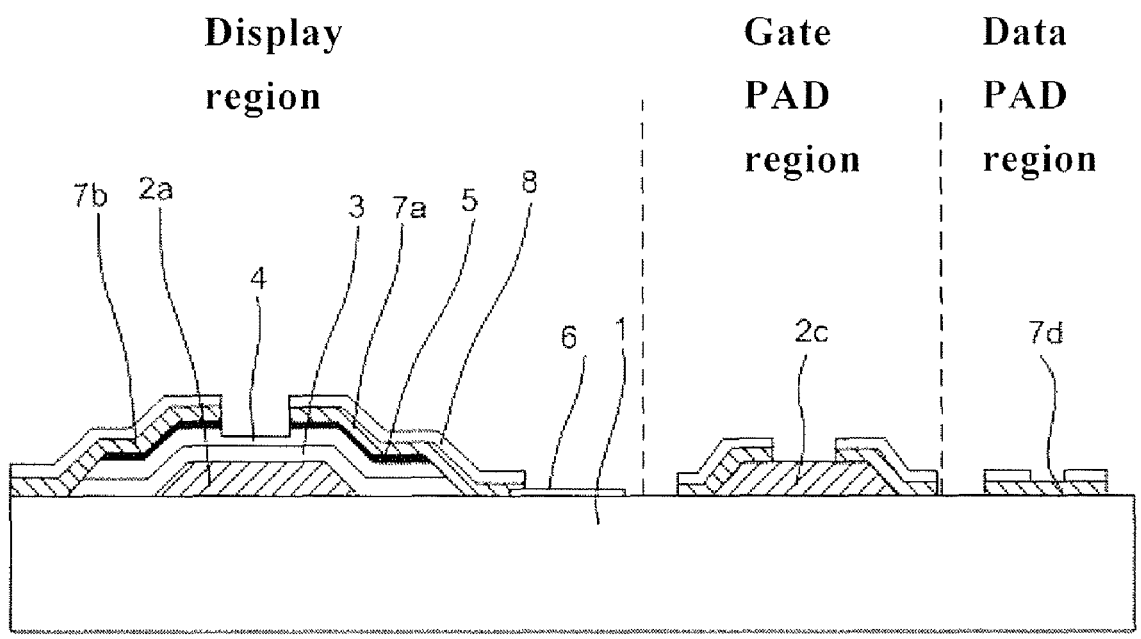
FIG. 9d is a cross-sectional view of the second embodiment after a fourth etching in the fourth patterning process.

FIG. 9d is a cross-sectional view of the second embodiment after the fourth etching in the fourth patterning process according to the invention. Finally, the fourth etching process in the fourth patterning process is performed, and then the remained photoresist film is lifted off through a photoresist lifting-off process so as to complete the fourth patterning process, as shown in FIG. 9d.

The gate line PAD region and the data line PAD region in the above embodiments correspond to the lead portion (connecting line) on the array substrate, which include a plurality of via holes exposing the gate line and the data line, and signals are inputted through the via holes for each gate line and data line. The data line PAD region in the embodiments of the invention not only refers to the pattern for connecting with a print circuit board (PCB), a tape carrier package (TCP) or a chip on film (COF) at one end of a gate line, but also refers to other patterns need to be opened in the gate metal layer. At the same time, the data line PAD region of the embodiment of the invention not only refers to the pattern for connecting with a PCB, a TCP or a COF at one end of a data line, but also refers to other patterns needed to be opened in the source/drain metal layer.

It can be seen from the above embodiments of the invention may involve a four-mask patterning process using a gray tone mask but is different from the conventional four-mask patterning process using a gray tone mask. In the embodiments, the pattern of the gate line and the gate electrode is firstly formed through the first patterning process, the pattern of the active layer is formed through the second patterning process, and the pixel electrode is formed through the third patterning process, and the pattern of the source electrode, the drain electrode and the data line electrode and the TFT channel are formed through the fourth patterning process using a gray tone mask. That is, the embodiments of the invention use a gray tone mask for forming the structure of the data line PAD region but use the conventional photolithography and etching processes for forming the TFT channel. In contrast, in the conventional four-mask patterning process, the TFT channel is formed in the second patterning process using a gray tone mask, which causes difference in the transmission in different areas on the mask due to the limitation of the fabricating accuracy of the mask and further influence on the uniformity of the photoresist pattern and gives rise to various kinds of defects in the TFT channel region in the subsequent multi-step etching process (that is, etching of the semiconductor layer→ashing→dry etching→etching of the doped semiconductor). For example, if there is no photoresist in the TFT channel region, the defect of channel opening is easy to occur. If the photoresist film in the TFT channel region is too thick, the defect of channel bridging tends to occur. In the embodiments of the invention, although the data line PAD region is formed with a gray tone mask, since the width of the data line PAD region is normally about 15 μm, larger than the length of the TFT channel of about 5 μm, the gray tone photolithography process can be more easily controlled and realized. Although the embodiments of the invention adopt a gray tone photolithography process, the TFT channel is still formed with a conventional photolithography process, and therefore the defects of the pixel in connection with the conventional four-mask process can be efficiently reduced, which improves the yield and the quality of the TFT array substrate for a LCD. At the same time, since the TFT channel is formed through the conventional photolithography process, the uniformity of the length of the TFT channel is increased remarkably, which improves the uniformity of the electrical characteristic of the TFT.

A method of manufacturing a TFT array substrate for a LCD according to an embodiment of the invention may comprise the following steps of:

(1) depositing a gate metal layer on a base substrate, forming a pattern of a gate electrode and a gate line, and forming a pattern of a gate connecting line in a gate line PAD region through a first patterning process;

(2) depositing a gate insulating layer, a semiconductor layer and a doped semiconductor layer sequentially on the base substrate after Step (1), and forming patterns of the gate insulating layer, the semiconductor layer and the doped semiconductor layer on the gate line and the gate electrode in a display region through a second patterning process;

(3) depositing a transparent conductive layer on the base substrate after step (2), and forming a pattern of a pixel electrode through a third patterning process; and (4) depositing sequentially a source/drain metal layer and a passivation layer sequentially on the base substrate after step (3), forming patterns of a drain electrode, a source electrode, a data line and a TFT channel in the display region and forming a data connecting line in the data line PAD region through a fourth patterning process, wherein the doped semiconductor layer in the TFT channel between the drain electrode and the source electrode is removed, the drain electrode is connected with the pixel electrode, the gate connecting line is exposed through a gate connecting line via hole in the gate line PAD region, the data connecting line is exposed through a data connecting line via hole in the data line PAD region.

The embodiment of the invention provides a manufacturing method of the TFT array substrate for a LCD, which is different from the four-mask patterning process using a gray tone mask. In the embodiment, the pattern of the gate line and the gate electrode is firstly formed through the first patterning process, the pattern of the active layer is formed through the second patterning process, the pixel electrode is formed through the third patterning process, and the patterns of the source electrode, the drain electrode, the data line and the TFT channel are formed through the fourth patterning process using the gray tone mask.

A first example of the method of manufacturing a TFT array substrate for a LCD according to the embodiment may comprise the following steps:

Step 11 of depositing a gate metal layer on a base substrate, forming a pattern of gate electrode and gate line, and forming a pattern of gate connecting line in a gate line PAD region through a first patterning process;

Step 12 of depositing a gate insulating layer, a semiconductor layer and a doped semiconductor layer on the base substrate after step 11, etching the doped semiconductor layer and the semiconductor layer through a second patterning process, so that the semiconductor layer and the doped semiconductor layer are etched completely in the gate line PAD region and the data line PAD region, and a pattern of the semiconductor layer and the doped semiconductor layer is formed on the gate insulating layer on the gate line and the gate electrode in the display region;

Step 13 of depositing a transparent layer on the base substrate after step 12, and forming a pattern of a pixel electrode on the gate insulating layer through a third pattering process;

Step 14 of depositing a source/drain layer and a passivation layer sequentially on the base substrate after step 13;

Step 15 of applying a layer of photoresist on the base substrate after step 14, patterning the photoresist with a gray tone mask so as to form a photoresist pattern that corresponds to the source electrode, the drain electrode, the data line, and the TFT channel in the display region, the data connecting line in the data line PAD region, and the gate connecting line in the gate line PAD region, wherein the photoresist pattern exposes the surface of the base substrate corresponding to the TFT channel, the pixel electrode, and a gate connecting line via hole and has a reduced thickness in a portion corresponding to the data connecting line via hole;

Step 16 of etching the exposed passivation layer, the source/drain metal layer and the doped semiconductor layer by using the photoresist pattern as an etching mask, so that the patterns of the drain electrode, the source electrode, the data line and the TFT channel are formed in the display region, the drain electrode is connected with the pixel electrode, the pattern of the data connecting line is formed in the data line PAD region, and the exposed passivation layer and the source/drain metal layer is etched in the gate line PAD region to expose the gate insulating layer;

Step 17 of thinning the layer of photoresist through a photoresist ashing process so as to remove the photoresist in the portion corresponding to the data connecting line via hole that exposes the passivation layer;

Step 18 of etching the gate insulating layer in the gate line PAD region so as to form a gate connecting line via hole that exposes the gate connecting line and etching the passivation layer in the data line PAD region by using the remaining photoresist pattern so as to form the data connecting line via hole that exposes the data connecting line; and Step 19 of lifting off the remained photoresist through a photoresist lifting-off process.

Specifically, the gate metal layer is deposited to a thickness of 500 Å~4000 Å on the base substrate (e.g., a glass substrate, a quartz substrate or a plastic substrate). The gate metal layer may be Cr, W, Ti, Ta, Mo, Al, Cu or the alloy thereof. The gate metal layer may be a multi-layer metal thin film. The gate metal layer is etched through the first patterning process so as to form the pattern of the gate electrode and the gate line in the display region on the base substrate and form the pattern of the gate connecting line in the gate line PAD region on the base substrate.

The gate insulating layer with a thickness of 1000 Å~4000 Å, a semiconductor layer with a thickness of 1000 Å~3000 Å and the doped semiconductor layer (the ohmic contact layer) with a thickness of 300 Å~600 Å are sequentially deposited on the substrate with the pattern of the gate electrode and the gate line formed thereon. The semiconductor layer and the doped semiconductor layer constitute the active layer. The gate insulating layer may be oxide, nitride or oxynitride, and the corresponding reactant gas may be a mixture gas of $SiH_4$, $NH_3$ and $N_2$ or a mixture gas of $SiH_2Cl_2$, $NH_3$ and $N_2$. The reactant gas corresponding to the semiconductor layer (e.g., an amorphous silicon layer) may be a mixture gas of $SiH_4$ and $H_2$ or a mixture gas of $SiH_2Cl_2$ and $H_2$, and the reactant gas corresponding to the doped semiconductor layer (e.g., a doped amorphous silicon layer) may be a mixture gas of $SiH_4$, $H_2$ and $PH_3$ or a mixture gas of $SiH_2Cl_2$, $H_2$ and $PH_3$. After depositing the above layers, the semiconductor layer and the doped semiconductor layer are etched through the second patterning process so as to etch the semiconductor layer and the doped semiconductor layer in the gate line PAD region and the data line PAD region completely and form the pattern of the semiconductor layer and the doped semiconductor layer in the display region. In the embodiment, the etching gas for the semiconductor layer and the doped semiconductor layer may be $SF_6/Cl_2$, $SF_6/HCl$ and the like.

After forming the pattern of the semiconductor layer and the doped semiconductor layer, the transparent conductive layer with a thickness of 300 Å~600 Å is deposited by a sputtering method or a thermal evaporation method, and the transparent conductive layer may be ITO or IZO. The transparent conductive layer is etched through the third pattering process so as to form the pattern of the pixel electrode in the pixel region and the pixel electrode is on the gate insulating layer.

After forming the pixel electrode, the source/drain metal layer with a thickness of 500 Å~2500 Å is deposited by a sputtering method or a thermal evaporation method, and the source/drain metal layer may be Cr, W, Ti, Ta, Mo, Al, Cu or the alloy thereof. Subsequently, the passivation layer with a thickness of 700 Å~2000 Å is deposited by a PECVD method, and the passivation layer may be oxide, nitride and oxynitride, and the corresponding reactant gas may be a mixture gas of $SiH_4$, $NH_3$ and $N_2$ or a mixture gas of $SiH_2Cl_2$, $NH_3$ and $N_2$. After depositing the passivation layer, a layer of photoresist is applied on the resultant substrate, the photolithography process is performed with a gray tone mask, in which the conventional lithography is performed for the display region, the gate line PAD region and other region needed to be opened in the gate metal layer, and the gray tone for the data line PAD region and other region needed to be opened in the source/drain metal layer. Specifically, the gray tone photoresist pattern has a normal thickness in the display region and the gate line PAD region and has a reduced thickness corresponding to via holes to be formed in the data line PAD region.

Firstly, the first etching process in the fourth patterning process is performed so as to etch the exposed passivation layer, the source/drain metal layer and the doped semiconductor layer in the display region and form the patterns of the drain electrode, the source electrode, the data line and the TFT channel. The source electrode is connected with the data line, the drain electrode is connected with the pixel electrode, and the pattern of the data connecting line is formed in the data line PAD region. The exposed passivation layer and the source/drain metal layer in the gate line PAD region are etched. Although the semiconductor layer and the doped semiconductor layer in the region have been etched in the second patterning process, since the etching process for the doped semiconductor layer has a good selectivity (normally larger than 5) to the gate insulating layer, the exposed gate insulating layer in the gate line PAD region can be remained. In the example, the etching gas for the passivation layer may be $SF_6/O_2$, $Cl_2/O_2$, $CF_4/O_2$ and the like, the etching gas for the source/drain metal layer may be $Cl_2/O_2$, $HCl/O_2$, $SF_6/Cl_2/O_2$ and the like, and the etching gas for the doped semiconductor layer may be $SF_6/Cl_2$ and the like. In the data line PAD region, since the photoresist film is remained in the gray tone photolithograph process, there is no etching occurring.

Thereafter, the second etching process in the fourth patterning process is performed, i.e., the ashing process for the photoresist, so that the photoresist formed by partial exposure in the data line PAD region is removed, and the passivation layer therebelow is exposed. Since the ashing process has a good selectivity (normally larger than 10) to the semiconductor layer exposed in the display region and the gate insulating layer exposed in the gate line PAD region, the semiconductor layer at the TFT channel and the gate insulating layer in the gate line PAD region are not etched in the process. In the present example, the etching gas for the ashing process may be $O_2$, $SF_6/O_2$ and the like.

Thereafter, the third etching process in the fourth patterning process is performed. In the process, the display region is not etched, the gate insulating layer in the gate line PAD region is etched so as to form a gate connecting line via hole that exposes the gate connecting line, and the passivation layer in the data line PAD region is etched so as to form a data connecting line via hole that exposes the data connecting line. In the example, the etching gas may be $SF_6/O_2$, $Cl_2/O_2$, $CF_4/O_2$ and the like. Since the etching process for the passivation layer has a good selectivity (normally larger than 5) to the semiconductor layer exposed in the display region, the semiconductor layer at the TFT channel in the third etching process is remained.

Finally, the fourth etching process in the fourth patterning process is performed, and the remaining photoresist is lifted off through the photoresist lifting-off process so as to complete the patterning process.

A second example of the method of manufacturing a TFT array substrate for a LCD according to the embodiment may comprise the following steps:

Step 21 of depositing a gate metal layer on a base substrate, forming a pattern of a gate electrode and a gate line, and forming a pattern of a gate connecting line in a gate line PAD region through a first patterning process;

Step 22 of depositing a gate insulating layer, a semiconductor layer and a doped semiconductor layer on the base substrate after step 21 and etching the doped semiconductor layer, the semiconductor layer and the gate insulating layer through a second patterning process, so that the doped semiconductor layer and the semiconductor layer and the gate insulating layer are etched completely in the gate line PAD region and in the data line PAD region, and patterns of the semiconductor layer, the doped semiconductor layer and the gate insulating layer are formed on the gate insulating layer on the gate line and the gate electrode in the display region;

Step 23 of depositing a transparent layer on the base substrate after step 22, and forming a pattern of a pixel electrode on substrate through the third pattering process;

Step 24 of depositing a source/drain layer and a passivation layer on the substrate after step 23;

Step 25 of applying a layer of photoresist on the base substrate after step 24, patterning the photoresist with a gray tone mask so as to form a photoresist pattern that corresponds to the source electrode, the drain electrode, the data line, and the TFT channel in the display region, the data connecting line in the data line PAD region, and the gate connecting line in the gate line PAD region, wherein the photoresist pattern exposes the surface of the base substrate corresponding to the TFT channel, the pixel electrode, and the gate connecting line via hole and has a reduced thickness in a portion corresponding to the data connecting line via hole;

Step 26 of etching the exposed passivation layer, the source/drain metal layer and the doped semiconductor layer by using the photoresist pattern as an etching mask, so that the patterns of the drain electrode, the source electrode, the data line and the TFT channel are formed in the display region, the drain electrode is connected with the pixel electrode, the pattern of the data connecting line in the data line PAD region, and the exposed passivation layer and the source/drain metal layer in the gate line PAD region is etched so as to form a gate connecting line via hole that exposes the gate connecting line;

Step 27 of thinning the layer of photoresist through a photoresist ashing process so as to remove the photoresist in the portion corresponding to the data connecting line via hole that exposes the passivation layer;

Step 28 of etching the passivation layer in the gate line PAD region so as to form a data connecting line via hole that exposes the data connecting line; and Step 29 of lifting off the remained photoresist by the photoresist lifting-off process.

Specifically, the gate metal layer is deposited to a thickness of 500 Å~4000 Å on the base substrate (e.g., a glass substrate, a quartz substrate or a plastic substrate). The gate metal layer may be Cr, W, Ti, Ta, Mo, Al, Cu or the alloy thereof. The gate metal layer may be a multi-layer metal thin film. The gate metal layer is etched through the first patterning process so as to form the pattern of the gate electrode and the gate line pattern in the display region on the substrate and form the pattern of the gate connecting line in the gate line PAD region on the substrate.

The gate insulating layer with a thickness of 1000 Å~4000 Å, a semiconductor layer with a thickness of 1000 Å~3000 Å and the doped semiconductor layer (the ohmic contact layer) with a thickness of 300 Å~600 Å are sequentially deposited on the substrate with the pattern of the gate electrode and the gate line formed thereon by a PECVD method. The semiconductor layer and the doped semiconductor layer constitute the active layer. The gate insulating layer may be oxide, nitride or oxynitride, and the corresponding reactant gas may be a mixture gas of $SiH_4$, $NH_3$ and $N_2$ or a mixture gas of $SiH_2Cl_2$, $NH_3$ and $N_2$. The reactant gas corresponding to the semiconductor layer (e.g., an amorphous silicon layer) may be a mixture gas of $SiH_4$ and $H_2$ or a mixture gas of $SiH_2Cl_2$ and $H_2$, and the reactant gas corresponding to the doped semiconductor layer (e.g., a doped amorphous silicon layer) may be a mixture gas of $SiH_4$, $H_2$ and $PH_3$ or a mixture gas of $SiH_2Cl_2$, $H_2$ and $PH_3$. After depositing the above layers, the semiconductor layer, the doped semiconductor layer and the gate insulating layer are etched through the second patterning process so as to etch the doped semiconductor layer, the semiconductor layer and the gate insulating layer in the gate line PAD region and the data line PAD region completely and form the patterns of the semiconductor layer, the doped semiconductor layer and the gate insulating layer in the display region. In the example, the etching gas for the semiconductor layer and the doped semiconductor layer may be $SF_6/Cl_2$, $SF_6/HCl$ and the like, and the etching gas for the gate insulating layer may be $SF_6/O_2$, $Cl_2/O_2$ and the like.

After forming the pattern of the semiconductor layer, the doped semiconductor layer and the gate insulating layer, the transparent conductive layer with a thickness of 300 Å~600 Å is deposited by a sputtering method or a thermal evaporation method, and the transparent conductive layer may be ITO or IZO. The transparent conductive layer is etched through the third pattering process so as to form the pattern of the pixel electrode in the pixel region, and the pixel electrode is formed on the gate insulating layer.

After forming the pixel electrode, the source/drain metal layer with a thickness of 500 Å~2500 Å is deposited by a sputtering method or a thermal evaporation method, and the source/drain metal layer may be Cr, W, Ti, Ta, Mo, Al, Cu or the alloy thereof. Subsequently, the passivation layer with a thickness of 700 Å~2000 Å is deposited by a PECVD method, and the passivation layer may be oxide, nitride and oxynitride, and the corresponding reactant gas may be a mixture gas of $SiH_4$, $NH_3$ and $N_2$ or a mixture gas of $SiH_2Cl_2$, $NH_3$ and $N_2$. After depositing the passivation layer, a layer of photoresist is applied, the photolithography process is performed with a gray tone mask, wherein the conventional lithography is performed for the display region, the gate line PAD region and other region needed to be opened in the gate metal layer, and the gray tone technology for the data line PAD region and other region needed to be opened in the source/drain metal layer. Specifically, the gray tone photoresist pattern has a normal thickness in the display region and the gate line PAD region and has a reduced thickness corresponding to via holes to be formed in the data line PAD region.

Firstly, the first etching process in the fourth patterning process is performed so as to etch the exposed passivation layer, the source/drain metal layer and the doped semiconductor layer in the display region, and form the patterns of the drain electrode, the source electrode, the data line and the TFT channel. The source electrode is connected with the data line, the drain electrode is connected with the pixel electrode, and a pattern of a data connecting line is formed in the data line PAD region. The exposed passivation layer and the source/drain metal layer in the gate line PAD region are etched so as to form a gate connecting line via hole that exposes the gate connecting line. In the data line PAD region, since the photoresist film is remained due to the gray tone photolithography, there is no etching occurring. In the embodiment, the etching gas for the passivation layer may be $SF_6/O_2$, $Cl_2/O_2$, $CF_4/O_2$ and the like, the etching gas for the source/drain metal layer may be $Cl_2/O_2$, $HCl/O_2$, $SF_6/Cl_2/O_2$ and the like, and the etching gas for the doped semiconductor layer may be $SF_6/Cl_2$ and the like.

Thereafter, the second etching process in the fourth patterning process is performed, i.e., the ashing process for the photoresist, so that the photoresist formed by partial exposure at the data line PAD region is removed, and the passivation layer 8 therebelow is exposed. Since the ashing process has a good selectivity (normally larger than 10) to the semiconductor layer exposed in the display region, the semiconductor layer at the TFT channel is not etched in the process. In the present embodiment, the etching gas for the ashing process may be $O_2$, $SF_6/O_2$ and the like.

Thereafter, the third etching process in the fourth patterning process is performed. In the process, the display region and the gate line PAD region is not etched, the passivation layer in the data line PAD region is etched so as to form a data connecting line via hole that exposes the data connecting line. In the embodiment, the etching gas may be $SF_6/O_2$, $Cl_2/O_2$, $CF_4/O_2$ and the like. Since the etching process for the passivation layer has a good selectivity (normally larger than 5) to the semiconductor layer and the gate metal layer, the semiconductor layer at the TFT channel and the gate metal layer in the gate line PAD region leave remained after the third etching process.

Finally, the fourth etching process in the fourth patterning process is performed, and the remained photoresist is lifted off through the photoresist lifting-off process, so as to complete the patterning process.

It can be seen from the above examples, the manufacturing method of the TFT array substrate for a LCD according to the invention is different from the conventional method using a gray tone technology. The invention uses a gray tone mask for forming the structure in the data line PAD region, and the TFT channel is formed through the conventional lithography and the etching process. Although the data line PAD region is formed by the gray tone technology, since the width of the data line PAD region is normally about 15 μm, larger than the length of the TFT channel of about 5 μm, the gray tone photolithography is much easier to be controlled and realized. Although the embodiment adopts the gray tone technology, the TFT channel is still formed by the conventional exposure and etching process, therefore the defects in the pixel due to the conventional four-mask process using a gray tone mask can efficiently reduced, which improves the yield and the quality of the product of the TFT array substrate for a LCD. At the same time, since the TFT channel is formed by the conventional lithography process, the uniformity of the length of the TFT channel can be increased remarkably, which improves the uniformity of the electrical characteristic of the TFT. The manufacturing method of the TFT array substrate for a LCD is a simple and stable process and easy for development, which reduces the requirement on equipment and decreases the product period and the product cost.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A thin film transistor (TFT) array substrate for a liquid crystal display, comprising:
a gate line and a data line formed in a display region,
a gate connecting line and a data connecting line formed in a PAD region,
a TFT formed at an intersection between the gate line and the data line, wherein the TFT comprises a gate electrode on a base substrate, a gate insulating layer on the gate electrode, a semiconductor layer on the gate insulating layer, a doped semiconductor layer on the semiconductor layer, and a source electrode and a drain electrode that are on the doped semiconductor layer, and a TFT channel is defined in the semiconductor layer between the source electrode and the drain electrode;
a passivation layer that is formed on the source electrode and the drain electrode; and
a pixel electrode, which is formed outside of the stacked layers of the semiconductor layer and the doped semiconductor layer and a portion of which is formed under the drain electrode and connected with the drain electrode.

2. The TFT array substrate for a liquid crystal display of claims 1, wherein the pixel electrode is formed on the gate insulating layer.

3. The TFT array substrate for a liquid crystal display of claims 1, wherein the pixel electrode is formed on the base substrate.

4. A method of manufacturing a thin film transistor (TFT) array substrate for a liquid crystal display, comprising the steps of:
- (1) depositing a gate metal layer on a base substrate and forming a pattern of a gate electrode and a gate line in a display region and a pattern of a gate connecting line in a gate line PAD region through a first patterning process;
- (2) depositing sequentially a gate insulation layer, a semiconductor layer and a doped semiconductor layer on the base substrate after step 1 and forming patterns of a gate insulation layer, a semiconductor layer and a doped semiconductor layer on the gate line and the gate electrode in the display region through a second patterning process;
- (3) depositing a transparent conductive layer on the base substrate after step 2 and forming a pattern of a pixel electrode by a third patterning process by patterning the transparent conductive layer; and
- (4) depositing sequentially a source/drain metal layer and a passivation layer on the base substrate after step 3 having the pattern of the pixel electrode, forming patterns of a drain electrode, a source electrode, a data line and a TFT channel in the display region and forming a data connecting line in a data line PAD region through a fourth patterning process by patterning the stacked layers of the source/drain metal layer and the passivation layer, wherein the doped semiconductor layer in the TFT channel between the drain electrode and the source electrode is removed, the drain electrode is connected with the pixel electrode, the gate connecting line is exposed through a gate connecting line via hole in the gate line PAD region, and the data connecting line is exposed through a data connecting line via hole in the data line PAD region.

5. The manufacturing method of claim 4, wherein the step 2 comprises the steps of:
- (211) depositing sequentially the gate insulating layer, the semiconductor layer and the doped semiconductor layer on the base substrate after step 1; and
- (212) etching the doped semiconductor layer and the semiconductor layer through the second patterning process so as to remove the semiconductor layer and the doped semiconductor layer in the gate line PAD region and the data line PAD region and form the patterns of the semiconductor layer and the doped semiconductor layer on the gate line and the gate electrode in the display region.

6. The manufacturing method of claim 5, wherein the step 3 comprises the steps of:
- (311) depositing the transparent conductive layer on the base substrate after step 2; and
- (312) forming the pattern of the pixel electrode on the gate insulating layer through the third patterning process.

7. The manufacturing method of claim 6, wherein the step 4 comprises the steps of:
- (411) depositing sequentially the source/drain metal layer and the passivation layer on the base substrate after step 3;
- (412) applying a layer of photoresist on the base substrate after step 411;
- (413) patterning the photoresist with a gray tone mask so as to form a photoresist pattern that corresponds to the source electrode, the drain electrode, the data line, and the TFT channel in the display region, the data connecting line in the data line PAD region, and the gate connecting line in the gate line PAD region, wherein the photoresist pattern exposes the surface of the base substrate corresponding to the TFT channel, the pixel electrode, and the gate connecting line via hole and has a reduced thickness in a portion corresponding to the data connecting line via hole;
- (414) etching the exposed passivation layer, the source/drain metal layer and the doped semiconductor layer by using the photoresist pattern as an etching mask, so that the patterns of the drain electrode, the source electrode, the data line and the TFT channel are formed in the display region, the drain electrode is connected with the pixel electrode, the pattern of the data connecting line is formed in the data line PAD region, and the exposed passivation layer and the source/drain metal layer is etched in the gate line PAD region to expose the gate insulating layer;
- (415) thinning the layer of photoresist through a photoresist ashing process so as to remove the photoresist in the portion corresponding to the data connecting line via hole that exposes the passivation layer;
- (416) etching the gate insulating layer in the gate line PAD region so as to form the gate connecting line via hole that exposes the gate connecting line and etching the passivation layer in the data line PAD region by using the remaining photoresist pattern so as to form the data connecting line via hole that exposes the data connecting line; and
- (417) lifting off the remained photoresist through a photoresist lifting-off process.

8. The manufacturing method of claim 6, wherein the step 2 comprises the steps of:
- (221) depositing sequentially the gate insulating layer, the semiconductor layer and the doped semiconductor layer on the base substrate after step 1; and
- (222) etching the doped semiconductor layer, the semiconductor layer and the gate insulating layer through the second patterning process so as to remove the semiconductor layer, the doped semiconductor layer and the gate insulating layer in the gate line PAD region and the data line PAD region and form the patterns of the semiconductor layer, the doped semiconductor layer and the gate insulating layer on the gate line and the gate electrode in the display region.

9. The manufacturing method of claim 8, wherein the step 3 comprises the steps of:
- (321) depositing the transparent conductive layer on the base substrate after step 2; and
- (322) forming the pattern of the pixel electrode on the base substrate through the third patterning process.

10. The manufacturing method of claim 9, wherein the step 4 comprises the steps of:
- (421) depositing the source/drain metal layer and the passivation layer sequentially on the base substrate after step 3;
- (422) applying a layer of photoresist on the base substrate after step 421;
- (423) patterning the photoresist with a gray tone mask so as to form a photoresist pattern that corresponds to the source electrode, the drain electrode, the data line, and the TFT channel in the display region, the data connecting line in the data line PAD region, and the gate connecting line in the gate line PAD region, wherein the photoresist pattern exposes the surface of the base substrate corresponding to the TFT channel, the pixel electrode, and the gate connecting line via hole and has a reduced thickness in a portion corresponding to the data connecting line via hole;
- (424) etching the exposed passivation layer, the source/drain metal layer and the doped semiconductor layer by using the photoresist pattern as an etching mask, so that the patterns of the drain electrode, the source electrode, the data line and the TFT channel are formed in the display region, the drain electrode is connected with the pixel electrode, the pattern of the data connecting line in the data line PAD region, and the exposed passivation layer and the source/drain metal layer in the gate line PAD region is etched so as to form the gate connecting line via hole that exposes the gate connecting line;

(425) thinning the layer of photoresist through a photoresist ashing process so as to remove the photoresist in the portion corresponding to the data connecting line via hole that exposes the passivation layer;

(426) etching the passivation layer in the data line PAD region by using the remaining photoresist pattern so as to form the data connecting line via hole that exposes the data connecting line; and (427) lifting off the remained photoresist through a photoresist lifting-off process.

* * * * *